United States Patent [19]

Jamet et al.

[11] Patent Number: 4,468,615
[45] Date of Patent: Aug. 28, 1984

[54] PROBE FOR A PRINTED-CIRCUIT TESTING DEVICE, AND A TESTING DEVICE INCORPORATING SAID PROBE

[75] Inventors: Michel Jamet; Jean Claude Urien; Gérard Bureau, all of Buc, France

[73] Assignee: Societe d'Etudes Techniques et d'Enterprises Generales Transmission Automatique & Informatique - Sodeteg Tai, Buc, France

[21] Appl. No.: 247,338

[22] Filed: Mar. 25, 1981

[30] Foreign Application Priority Data

Mar. 26, 1980 [FR] France .................................. 80 06691

[51] Int. Cl.³ ........................ G01R 1/06; G01R 31/02
[52] U.S. Cl. .................................. 324/158 P; 324/72.5
[58] Field of Search ............... 324/158 P, 158 F, 72.5; 200/275, 279; 339/108 TP

[56] References Cited

U.S. PATENT DOCUMENTS 4,105,970 8/1978 Katz ................................. 324/158 P Primary Examiner—Ernest F. Karlsen

[57] ABSTRACT

A probe for a device which serves to test both bare printed circuits and printed circuits equipped with components has a head machined in a conductive cylindrical segment placed at the end of a rod slidably mounted within a piston body. The probe head has a central pyramidal portion surrounded at its base by a crown provided with sharp curvilinear edges. Electrical contacts with either bare printed circuits or printed circuits equipped with components are established by the pyramidal portion and/or the crown, depending on the relative positions of the probe head and of the metallized holes or connection strips of the components or solder-spot connections of the circuits being tested.

4 Claims, 7 Drawing Figures

U.S. Patent  Aug. 28, 1984  Sheet 1 of 2  4,468,615
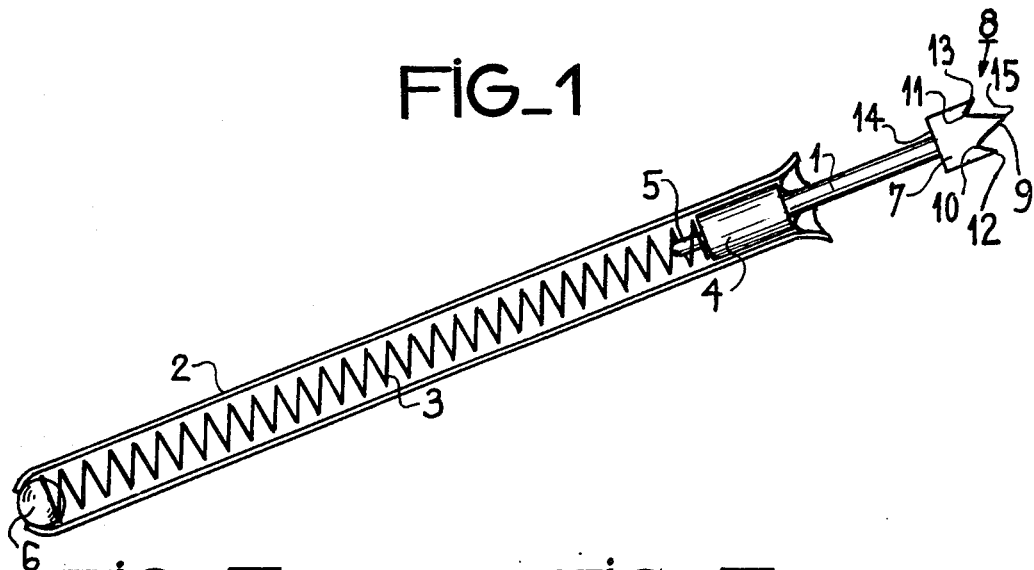
FIG_1
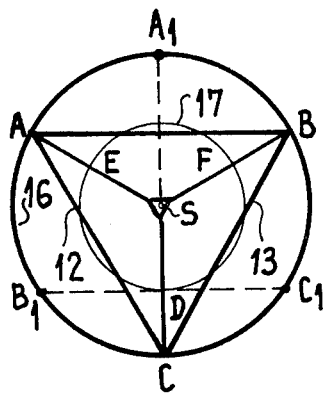
FIG_2
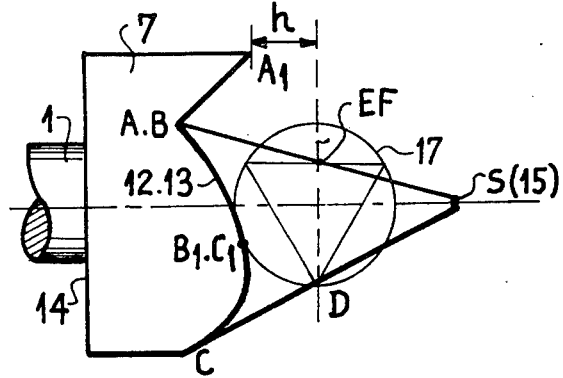
FIG_3
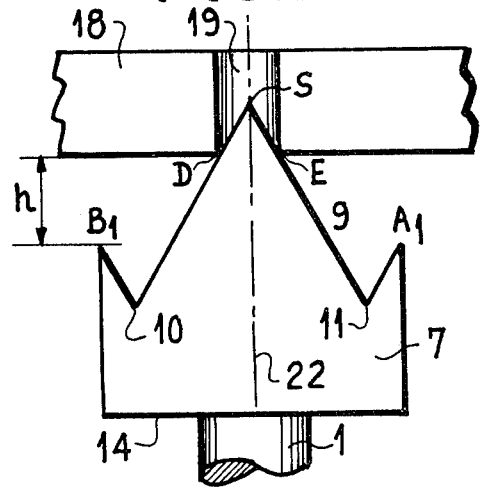
FIG_4

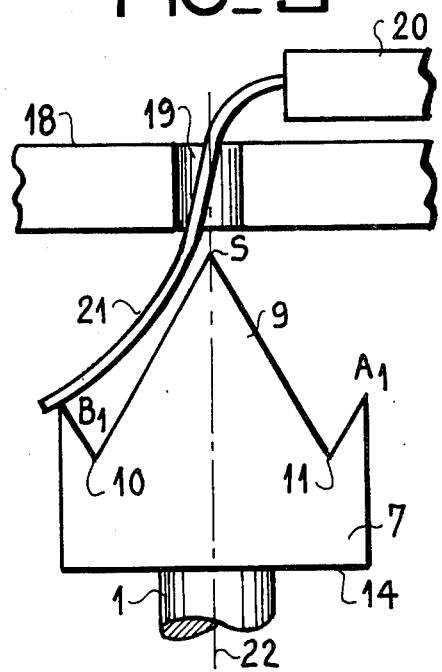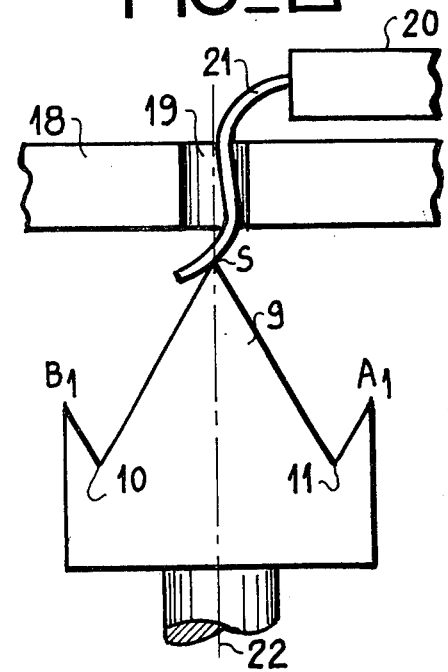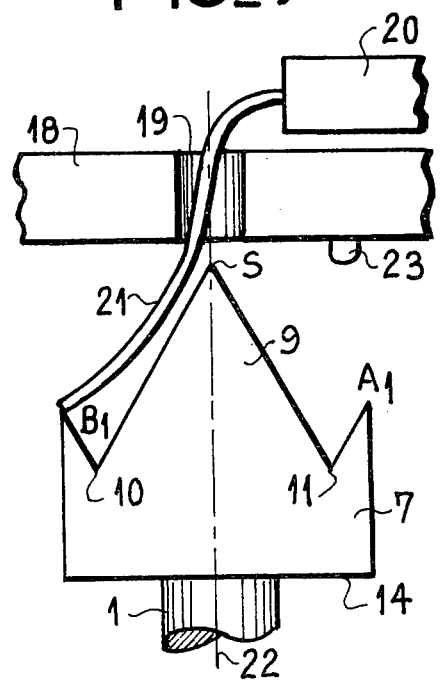

PROBE FOR A PRINTED-CIRCUIT TESTING DEVICE, AND A TESTING DEVICE INCORPORATING SAID PROBE

BACKGROUND OF THE INVENTION

This invention relates to a probe for a printed-circuit testing device, said probe being intended to permit testing of either bare circuits or circuits equipped with components. When produced on a large scale by means of semi-automatic or fully automatic operations, printed circuits have to be checked prior to delivery or use with a view to ensuring good operating conditions or on the contrary to detecting any possible fault locations. As a general rule, inspection and testing operations are performed automatically by means of test instruments or devices for checking up to 4000 points on these circuits, the tests being carried out in time intervals of relatively short duration, namely of the order of 5 seconds or sometimes less.

A printed-circuit testing device is usually made up of three sections, namely a base system, measuring heads and a suction unit. The respective functions of these different sections are as follows: the base system provides an interface between the measuring heads and a wiring tester; the measuring heads provide the interface between the printed circuits to be tested and the measuring system and the suction unit is intended to produce a partial vacuum within the device in order to apply the printed circuit to be tested against the measuring head and to ensure a better contact between the circuit and the probes carried by the measuring head. The design function of said probes is to establish an electrical connection between one point of the printed circuit on which the probe head is brought to bear and the wiring tester.

Testing of printed circuits must be practicable in the case of either a bare circuit or a circuit equipped with components. At the present time, however, it is not possible to employ a single probe in order to carry out both these two tests under good conditions. Whereas the probes which are employed for testing bare circuits and which have a head consisting of a point are capable of establishing a contact with the metallized holes of the circuit, this will no longer be the case with equipped circuits in which component connection strips which are endowed with a certain degree of flexibility cannot be gripped by the probe head; there will either be no contact or a poor contact and the test will be inconclusive. In order to test an equipped circuit, it will therefore be necessary to change the probes. In some designs, the probe heads employed for testing printed circuits equipped with components are either grooved or crown-shaped. In this case, although gripping of connection strips is achieved under more satisfactory conditions and it is possible to establish a better contact with solder-spot connections, this no longer holds true if it is desired to change-over to testing of a bare circuit since the probe head cannot come into contact with a metallized hole. Furthermore, since the probe head has a certain surface area in this case, there is a potential danger of establishing a contact both with the collar which surrounds the orifice of a metallized hole and with the tracks which are located in the immediate vicinity, with the result that there is an attendant danger of short-circuits.

SUMMARY OF THE INVENTION

The aim of the invention is to avoid such drawbacks while defining a probe which can be employed both for testing bare circuits and for testing printed circuits equipped with components.

According to the invention, a probe for a printed-circuit testing device operates on the principle of initiation of electrical contacts between the probe head and the printed circuit being tested, the head being placed at the end of a rod slidably mounted within a piston body. The distinctive feature of the invention lies in the fact that the probe head is machined in a conductive cylindrical segment mounted at the end of the sliding rod so as to have a pyramidal portion which is centered on the axis of symmetry of the cylindrical segment with the pyramidal portion having triangular faces. Grooves are machined at the lower ends of the pyramid faces, thus forming a crown portion having sharp curvilinear edges, the height of which is substantially lower than the height of the apex of the pyramid. The configuration thus defined permits the use of a single probe in order to test both a bare printed circuit and a printed circuit equipped with components.

BRIEF DESCRIPTION OF THE DRAWINGS

Other features of the invention will be more apparent upon consideration of the following description and accompanying drawings, wherein:

FIG. 1 is a general view of a test probe according to the invention;

FIG. 2 is a top view of the probe head according to the invention;

FIG. 3 is a plan view of the probe head;

FIG. 4 is a sectional view of the probe head employed for testing a bare printed circuit;

FIGS. 5, 6 and 7 are sectional views of the probe employed for testing a printed circuit equipped with components.

DESCRIPTION OF A PREFERRED EMBODIMENT

As already mentioned in the introductory part of this specification, the aim of the invention is to define a probe for a printed-circuit testing device, which can be employed either for a bare printed circuit or for a printed circuit equipped with components.

It has been mentioned that probes of the prior art could not be used for carrying out both types of test. In actual fact, a probe having a tapered and rounded head is more particularly capable of testing the metallized holes of the circuit. A probe of this type is capable of penetrating into the holes but is ill-suited to testing of equipped circuits since an accurate contact cannot be established between the rounded probe head and the connection strips of the components or the solder spots. A probe having a grooved or crown-shaped head is particularly well-suited to testing of equipped printed circuits by reason of the fact that the grooves or recesses of the crown permit easier gripping of the connection strips or solder-spot connections. However, a probe of this type is not capable of testing the metallized holes of a bare circuit. Moreover, since the grooves or notches are practically all located at the same level, there is a potential danger of short-circuits by reason of the fact that the probe head is capable of coming into contact both with the collar which surrounds the orifice of the metallized hole and with the tracks located in the immediate vicinity.

FIG. 1 illustrates a probe according to the invention. Said probe comprises a sliding rod or plunger 1 which is capable of displacement within a cylindrical body 2. A spring 3 is mounted within said cylindrical body and applied against the inner plunger face 4 which is provided with a nipple 5 and against a ball 6 located at that end of the cylindrical body which is remote from the plunger. Said plunger 1 terminates in a head machined in a circular cylindrical segment 7 so as to have a notched sectional profile 8. In more specific terms, machining is performed in such a manner as to ensure that the head has a portion 9 which constitutes a pyramid having a triangular base and faces, the recesses 10 and 11 being grooves cut in the cylindrical segment at the lower ends of the triangular faces of the pyramid, thus forming around the triangular base a crown having three sharp edges such as the edges 12, 13. It will be noted that the height of the edges 12 and 13 from the base 14 of the cylindrical segment in which the probe head is machined is distinctly lower than the height at which the apex 15 of the pyramid is located, thus defining a guard height.

FIG. 2 is a top view showing the probe head whilst FIG. 3 is a plan view of said head. There is shown in FIG. 2 the pyramid SABC having a triangular base inscribed within the circle 16 constituting the base of the cylinder in which the probe head is machined. There are shown in FIGS. 2 and 3 the edges SA, SB, SC of the pyramid having an apex S, where SA and SB coincide in the view of FIG. 3. The common point AB in FIG. 3 represents the bottom of the groove cut at the lower end of the base of the pyramid face SAB. Similarly, the edge SC of the pyramid is shown in this figure. Between the points A, B, C representing the apices of the base triangle of the pyramid are placed the edges of the crown which is machined in the probe head, said edges AB, BC and CA being located on the surface of the base cylinder in which the probe head is machined. These curvilinear edges each have a point located substantially at the center of the corresponding edge. Said points are designated by the references A1, B1 and C1 in FIGS. 2 and 3, the points A1 and B1 being designated by the reference numerals 12 and 13 in FIG. 1.

It will be noted that machining of a probe head of this type is carried out by any suitable means such as milling, for example.

There is shown in FIGS. 2 and 3 a circle 17 representing a metallized hole of a printed-circuit plate in which the pyramidal portion of the probe head under consideration can be introduced, the edges of said pyramidal portion being intended to come into contact with the hole at the points DEF.

FIG. 4 is a sectional view showing the head of the probe according to the invention, said head being employed for testing a bare printed circuit. There is shown at 18 the bare printed circuit in which is formed, for example, a metallized hole 19. At the moment of testing, when the printed circuit 18 is applied against the measuring head of the testing device (not shown in the figure) as a result of the partial vacuum produced within said device, the pyramidal portion 9 of the probe head penetrates into the hole without difficulty and a contact is established at the points D and E. It will be noted that the positions of said points D and E on the edges of the pyramidal point 9 of the probe head depend on the vertex angle of the pyramid and therefore on the angle of slope of the edges with respect to the axis of symmetry 22 of the pyramid. Said angle of slope is chosen so as to ensure that the pyramid is in contact with the holes when the edges A1 and B1 of the crown are in a position which prevents any contact between said edges and the printed circuit. The distance h constitutes the guard height defined earlier.

FIGS. 5, 6 and 7 are sectional views showing the head of a probe according to the invention which is employed for testing a printed circuit equipped with components. One of these components designated by the reference numeral 20 is shown with its connection strip 21 which passes through a metallized hole 19.

At the moment of testing carried out with a probe provided with a head in accordance with the invention and designed for testing a bare printed circuit as already explained, the connection strip can have different positions with respect to the probe head.

In FIG. 5, the connection strip 21 comes into contact with the edge B1 of the crown and will remain in contact by gripping and locking within the groove 10.

In FIG. 6, the connection strip 21 will come into contact with the apex S of the pyramid and can then be locked in a position in which it is also in contact within the groove 10.

In FIG. 7, the connection strip 21 will be immediately locked in contact within the groove 10 of the probe head.

Different relative positions of the probe head and of component connection strips may be conceived. The positions shown in the figure constitute particular positions from which all others may be derived.

The cases of FIGS. 4 to 7 serve only to show that the probe head according to the invention can be employed both for testing bare printed circuits and for testing printed circuits equipped with components.

It will be noted that the probe head according to the invention is also capable of testing solder-spot connections as designated by the reference 23 which project from the printed-circuit plate and, in the same manner as all the connection strips, are gripped by the crown which is machined in the probe head.

It will further be noted that the probe head has a pyramidal central portion having a triangular base and a three-point crown. This configuration is an optimum configuration which combines the possibility of establishing contacts under optimum conditions at the time of testing of both bare circuits and equipped circuits with ease of fabrication of probe heads.

In one example of construction, the base triangle of the pyramid is equilateral and the angle of a groove is 60°.

There has thus been described a probe and more specifically a probe head for a device which serves to test printed circuits, whether said circuits are bare or equipped with components.

What is claimed is:

1. A probe for a printed-circuit testing device which operates on the principle of initiation of electrical contacts comprising, a rod, a tubular body and a head at an end of the rod, said rod being slidably mounted in said tubular body, said head constituting a conductive cylindrical segment provided at the free end of said rod, said cylindrical segment being formed with a central pyramidal portion having triangular faces, an apex, and a triangular base, said triangular base defined by the bottoms of grooves cut in the cylindrical segment which terminates at the lower edges of the triangular faces of said pyramidal portion, said grooves defining a crown portion having three projecting portions on said segment each projecting portion terminating in a sharp edge, said projecting portion being of a height from the base of said segment of approximately one-half of the height of said pyramidal portion from the base of said segment as to enable said apex to be in contact with a metallized hole in said printed circuit without any contact of said crown portion with a component borne by said printed circuit, thereby permitting the use of a single probe for testing both a base printed circuit and a printed circuit equipped with components.

2. A probe according to claim 1, wherein the edges of the pyramidal portion of the probe head establish a contact with a metallized hole of a printed circuit at three points.

3. A probe according to claim 1, wherein the contact between the probe head and a metallized hole of a printed circuit is established by the pyramidal apex portion which has penetrated into said hole, the angle of slope of the edges of the pyramid being such as to define a so-called guard height between the printed circuit being tested and the projecting portions of the crown.

4. A probe according to claim 1, wherein the contact between the probe head and the connection strip of a component placed on the printed circuit being tested or a solder-spot connection is established by the sharp projecting portions of the crown and/or the points as well as the pyramidal portion of said crown according to the positions of said connection strips or solder-spot connections with respect to said probe head.

* * * * *